United States Patent
Hung

[11] Patent Number: 5,981,325
[45] Date of Patent: Nov. 9, 1999

[54] METHOD FOR MANUFACTURING CMOS

[75] Inventor: Tsung-Yuan Hung, Tainan, Taiwan

[73] Assignees: United Semiconductor Corp.; United Microelectronics Corp., both of Hsinchu, Taiwan

[21] Appl. No.: 09/299,255

[22] Filed: Apr. 26, 1999

[51] Int. Cl.$^6$ ............................................... H01L 21/8238
[52] U.S. Cl. ........................... 438/224; 438/230; 438/231
[58] Field of Search .................... 438/199, 223, 438/224, 227, 228, 229, 230, 231, 232, 303, 595

[56] References Cited

U.S. PATENT DOCUMENTS

| | | | |
|---|---|---|---|
| 5,759,885 | 6/1998 | Son | 438/230 |
| 5,766,991 | 6/1998 | Chen | 438/231 |
| 5,851,866 | 12/1998 | Son | 438/231 |
| 5,898,203 | 4/1999 | Yoshitomi et al. | 257/344 |

*Primary Examiner*—Charles Bowers
*Assistant Examiner*—Jack Chen
*Attorney, Agent, or Firm*—Jiawei Huang; J.C. Patents

[57] ABSTRACT

A method of manufacturing a CMOS. A substrate is provided, wherein the substrate has a first conductive-type well, a second conductive-type well, an isolation structure formed therein, a first gate electrode on the second conductive-type well and a second gate electrode on the first conductive-type well. The first conductive-type well and the second conductive-type well are partly isolated from each other by the isolation structure. A first offset spacer is formed on a sidewall of the first and the second gate electrodes and a second offset spacer on a sidewall of the first offset spacer, wherein a portion of the first offset spacer extends on a surface of the substrate and the second offset spacer is on the portion of the first offset spacer. A first LDD region having the first conductive type is formed in a portion of the second conductive-type well exposed by the first gate electrode, the first offset spacer and the second offset spacer. The second offset spacer is removed to expose a portion of the first offset spacer extending on a portion of a surface of the substrate. A second LDD region having the second conductive type is formed in a portion of the first conductive-type well and exposed by the second gate electrode and the first offset spacer under the portion of the first offset spacer extending on a portion of a surface of the substrate. A spacer is formed on a sidewall of the first and the second gate electrodes. A first doped region having the first conductive type is formed in a portion of the second conductive-type well exposed by the first gate electrode, the first offset spacer and the spacer. A second doped region having the second conductive type is formed in a portion of the first conductive-type well exposed by the second gate electrode, the first offset spacer and the spacer.

8 Claims, 2 Drawing Sheets

METHOD FOR MANUFACTURING CMOS

CROSS-REFERENCE TO RELATED APPLICATION

This application claims the priority benefit of Taiwan application serial no. 88104316, filed Mar. 19 1999. the full disclosure of which is incorporated herein by reference.

BACKGROUND OF THE INVENTION

1. Field of the Invention

The present invention relates to a method of manufacturing a complementary metal-oxide semiconductor (CMOS). More particularly, the present invention relates to a method of manufacturing a CMOS having an offset spacer structure.

2. Description of the Related Art

Typically, the offset spacer in the MOS manufacturing process is used to lower the overlap capacitance between a gate electrode and a source/drain region, which in turn increases the operation rate of the MOS. A structure called an overlap capacitor is a capacitor constructed by the overlap between the gate electrode of a transistor and the source/drain region. The source/drain region of the transistor is adjacent to and under the gate electrode.

Commonly, the punch-through margins of the channels of the NMOS and the PMOS are reduced as the size of the semiconductor is reduced. Typically, the source/drain region of the PMOS is formed by implanting boron ions into the substrate and the source/drain region of the NMOS is formed by implanting phosphorus ions or arsenic ions into the substrate. Since the radius of the boron ion is relatively small, the thermal diffusion rate of the boron ion in the substrate is relatively fast when an annealing process is performed. The margin of the source/drain region of the PMOS expands more seriously than that of the NMOS after the CMOS is annealed, so that the channel of the PMOS is shorter than that of the NMOS. Therefore, the punch-through problem of the PMOS easily happens and the off current is increased.

Conventionally, the width of the offset spacer of the CMOS is modified to adjust the length of the channels of the PMOS and the NMOS. The punch-through of the PMOS can be greatly improved, however, the saturated current of the drain of the NMOS is decreased, simultaneously. Therefore, the adjustment of the width of the offset spacer has no benefit for the operation rate of the CMOS. Since the channel of the PMOS and the channel of the NMOS cannot be respectively and effectively adjusted, the process window is very narrow. Hence, it is difficult to overcome the off current problem of the PMOS and the problem of the saturated current of the drain of the NMOS, spontaneously.

SUMMARY OF THE INVENTION

The invention provides a method of manufacturing a CMOS having an offset spacer structure. By using the invention, generation of the short channel effect can be avoided even though the ions have a relatively fast diffusion rate. Moreover, the overlap capacitance between a gate electrode and a source/drain region is decreased. Furthermore, the process window can be increased.

To achieve these and other advantages and in accordance with the purpose of the invention, as embodied and broadly described herein, the invention provides a method of manufacturing a CMOS on a substrate having a first conductive-type well, a second conductive-type well, an isolation structure formed therein, a first gate electrode on the second conductive-type well and a second gate electrode on the first conductive-type well, wherein the first conductive-type well and the second conductive-type well are partly isolated from each other by the isolation structure. A conformal insulating layer is formed on the first gate electrode and the second gate electrode and over the substrate. An insulating layer is formed on the conformal insulating layer. A portion of the conformal insulating layer and the insulating layer are removed to expose the top surfaces of the first gate electrode and the second gate electrode and a portion of the substrate to respectively form a first offset spacer and a second offset spacer, wherein the first offset spacer is on a sidewall of the first and the second gate electrodes and the second offset spacer is on a sidewall of the first offset spacer. A first LDD region having the first conductive type is formed in a portion of the second conductive-type well exposed by the first gate electrode, the first offset spacer and the second offset spacer. The second offset spacer is removed to expose a portion of the first offset spacer extending on a portion of a surface of the substrate. A second LDD region having the second conductive type is formed in a portion of the first conductive-type well, wherein the second LDD region extends from a region exposed by the second gate electrode and the first offset spacer to a region under the portion of the first offset spacer extending on a portion of a surface of the substrate. A spacer is formed on a sidewall of the first and the second gate electrodes. A first doped region having the first conductive type is formed in a portion of the second conductive-type well exposed by the first gate electrode, the first offset spacer and the spacer. A second doped region having the second conductive type is formed in a portion of the first conductive-type well exposed by the second gate electrode, the first offset spacer and the spacer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
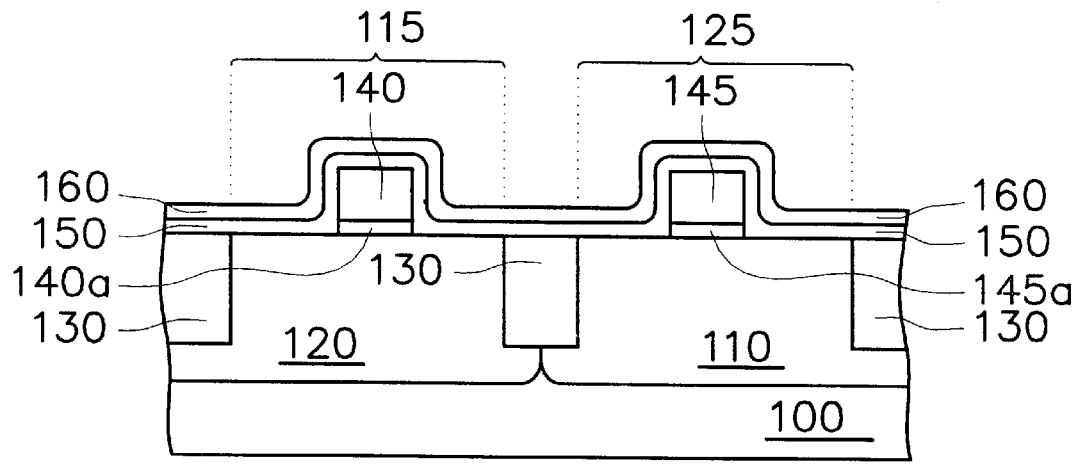
FIGS. 1A through 1E are schematic, cross-sectional views of the process for manufacturing a double-offset spacer of a transistor in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views of the process for manufacturing a double-offset spacer of a transistor in a preferred embodiment according to the invention.

As shown in FIG. 1A, a substrate having a well region 110 with a first conductive type, a well region 120 with a second conductive type and an isolation structure 130 is provided. The well region 110 and the well region 120 are partly isolated from each other by the isolation structure 130. The isolation structure 130 can be a shallow trench isolation, for example. The isolation structure 130 defines a first active region 115 and a second active region 125 respectively in the well region 110 and the well region 120. Gate electrodes 140 and 145 respectively having gate oxide layers 140a and 145a under the gate electrodes 140 and 145 are formed over a portion of the substrate 100 in the first active region 115 and the second active region 125, respectively. A conformal insulating layer 150 is formed on the gate electrodes 140 and 145, the isolation structure 130 and the substrate 100. The conformal insulating layer 150 can be formed from silicon oxide by low-pressure chemical vapor deposition (LPCVD) with a tetraethyl orthosilicate (TEOS) gas source, for example. The conditions of the LPCVD for forming the conformal insulating layer 150 include a temperature about of 650–750° C. and a pressure about of 1–10 torr. An insulating layer 160 is conformally formed on the conformal insulating layer 150. The insulating layer 160 can be formed from silicon nitride by LPCVD with a gas source of $Si_2Cl_2$ and $NH_3$, for example. The conditions of the LPCVD for forming the insulating layer 160 include a temperature about of 700–800° C. and a pressure about of 0.1–1 torr.

Figure 1B:
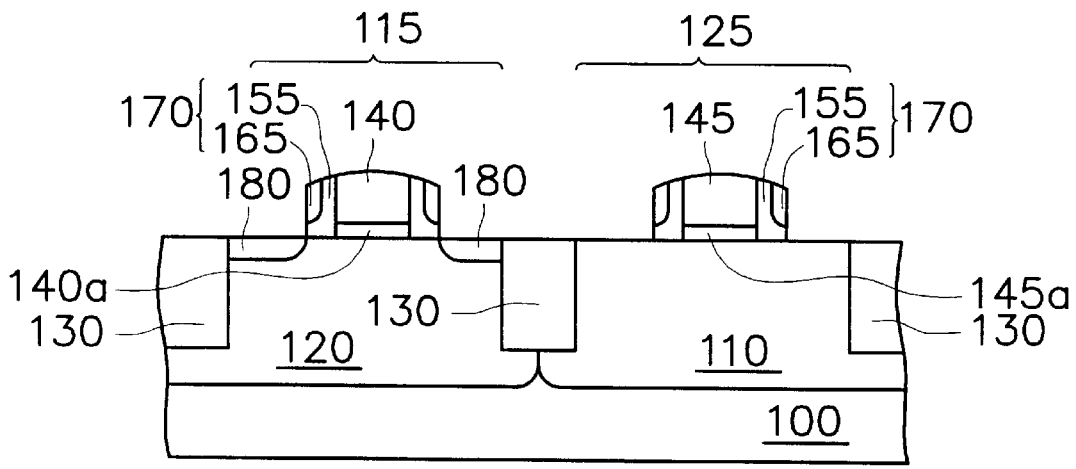

As shown in FIG. 1B, a portion of the conformal insulating layers 150 and 160 (as shown in FIG. 1A) is removed until the top surfaces of the gate electrodes 140 and 145 and a portion of the substrate 100 are exposed. The remaining conformal insulating layers 150 and 160 on the sidewall of the gate electrodes 140 and 145 are respectively denoted as a first offset spacer 155 and a second offset spacer 165. The first offset spacer 155 and the second offset spacer 165 together form a double offset spacer 170. If the material of the conformal insulating layer 150 is silicon oxide and the material of the insulating layer 160 is silicon nitride, the portion of the conformal insulating layers 150 and 160 can be removed by an isotropic etching. The an isotropic etching can be plasma etching with fluoride, for example. A patterned photoresist (not shown) is formed over the second active region 125. An ion implanting step is performed to form an LDD region 180 having the first conductive type in a portion of the first active region 115 exposed by the gate electrode 140, the double offset spacer 170, the isolation structure 130 and the photoresist. The patterned photoresist is removed.

Figure 1C:
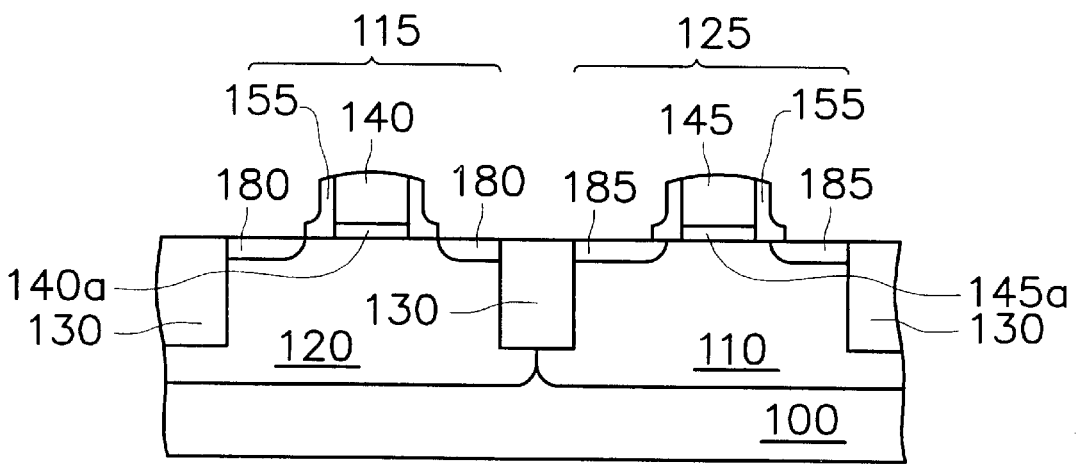

As shown in FIG. 1C, the second offset spacer 165 (as shown in FIG. 1B) is removed to expose the sidewall of the first offset spacer 155. When the material of the second offset spacer is silicon nitride, the second offset spacer can be removed by hot phosphoric acid, for example. A patterned photoresist (not shown) is formed over the first active region 115. An ion implanting step is performed to form an LDD region 185 having the second conductive type in a portion of the second active region 125 exposed by the gate electrode 145, the first offset spacer 155, the isolation structure 130 and the photoresist. Since the first offset spacer 155 is an L-type offset spacer, a portion of the first offset spacer 155 extending on the surface of the second active region 125 is relatively thin. Hence the implanting ions penetrate through the portion of the first offset spacer 155 extending on a portion of the surface of the second active region 125 and into the second active region 125. But the implanting ions do not penetrate through the other portion of the first offset spacer 155 formed on the sidewall of the gate electrode 145. Therefore, the range of the LDD region 185 further comprises a portion of the second active region 125 under the portion of the first offset spacer 155 extending on the portion of the surface of the second active region 125. The patterned photoresist is removed.

Figure 1D:
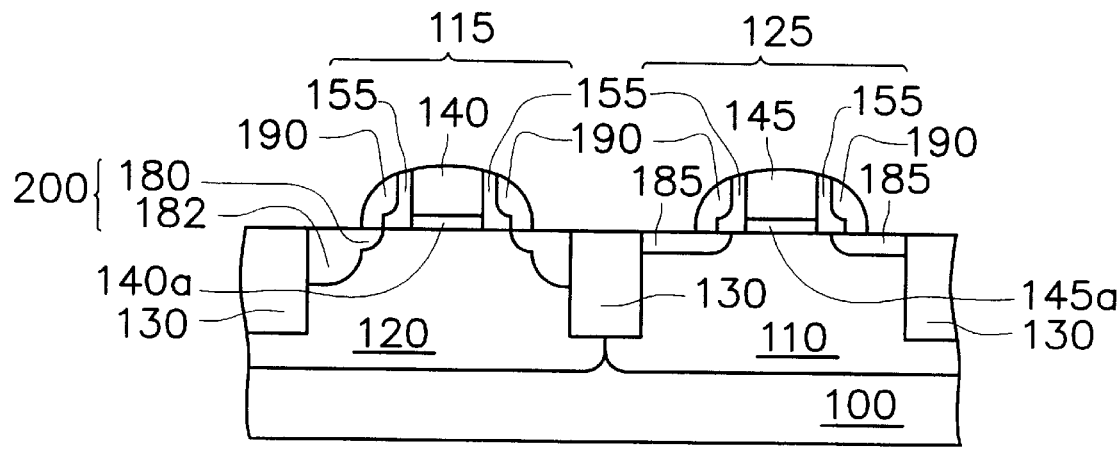

As shown in FIG. 1D, a spacer 190 is formed on the sidewall of the first offset spacer 155. The material of the spacer 190 can be silicon nitride, for example. A patterned photoresist (not shown) is formed to cover the second active region 125. An ion implanting step is performed to formed a doped region 182 having the first conductive type in a portion of the first active region 115 exposed by the electrode gate 140, the spacer 190, the isolation structure 130 and the photoresist. The doped region 182 and the LDD region 180 together form a source/drain region 200. The patterned photoresist is removed. Therefore, the process for manufacturing a first-type MOS is finished. The first-type MOS can be a PMOS.

Figure 1E:
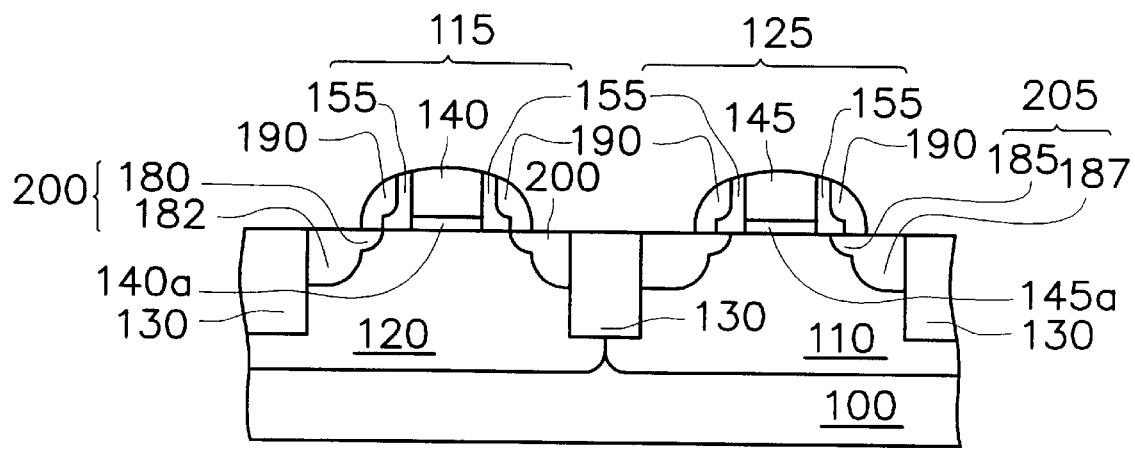

As shown in FIG. 1E, a patterned photoresist (not shown) is formed to cover the first active region 1115. An ion implanting step is performed to form a doped region 187 having the second conductive type in a portion of the second active region 125 exposed by the electrode gate 145, the spacer 190, the isolation structure 130 and the photoresist. The doped region 187 and the LDD region 185 together form a source/drain region 205. The patterned photoresist is removed. Therefore, the process for manufacturing a second-type MOS is finished. The second-type MOS can be an NMOS.

In the invention, the first conductive type can be P-type, when the second conductive type is N-type. Conversely, when the second conductive type is P-type, the first conductive type can be N-type. Preferably, the diffusion rate of the first conductive-type ion in the substrate 100 is relatively fast. Since the LDD region 180 is formed in the first active region 115 exposed by the gate electrode 140, the double offset spacer 170 and the isolation structure 130, it has relatively long channel length to avoid generation of the short channel effect even though the ions have a relatively fast diffusion rate.

The invention includes the following advantages:

1. In the invention, the LDD region having the implanting ions with a relatively fast diffusion rate is formed in the first-type MOS exposed by the gate electrode, the double offset spacer and the isolation structure. The punch-through margin in the invention is larger than that in the prior art after the annealing process is performed. Hence, it has relatively long channel length to avoid generation of the short channel effect even though the ions have a relatively fast diffusion rate.

2. In the invention, the length of the channel in the first-type MOS is increased, so that the overlap between the gate electrode and the source/drain region is decreased. The overlap capacitance between a gate electrode and a source/drain region is decreased.

3. In the invention, the portion of the first offset spacer extending on the surface of the substrate is used to adjust each length of the channels in the first-type MOS and the second-type MOS. Hence, the channel in the first-type MOS is increased but the saturated current of the drain of the second-type MOS will not decrease. Therefore, the process window can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a CMOS on a substrate having a first conductive-type well, a second conductive-type well, an isolation structure formed therein, a first gate electrode on the second conductive-type well and a second gate electrode on the first conductive-type well wherein the first conductive-type well and the second conductive-type well are partly isolated from each other by the isolation structure, the method comprising the steps of:

forming a conformal insulating layer on the first gate electrode and the second gate electrode and over the substrate;

forming an insulating layer on the conformal insulating layer;

removing a portion of the conformal insulating layer and the insulating layer to expose a top surface of the first gate electrode and the second gate electrode and a portion of the substrate to respectively form a first offset spacer and a second offset spacer, wherein the first offset spacer is on a sidewall of the first and the second gate electrodes and the second offset spacer is on a sidewall of the first offset spacer;

forming a first LDD region having the first conductive type in a portion of the second conductive-type well exposed by the first gate electrode, the first offset spacer and the second offset spacer;

removing the second offset spacer to expose a portion of the first offset spacer extending on a portion of a surface of the substrate;

forming a second LDD region having the second conductive type in a portion of the first conductive-type well, wherein the second LDD region extends from a region exposed by the second gate electrode and the first offset spacer to a region under the portion of the first offset spacer extending on a portion of a surface of the substrate;

forming a spacer on a sidewall of the first and the second gate electrodes;

forming a first doped region having the first conductive type in a portion of the second conductive-type well exposed by the first gate electrode, the first offset spacer and the spacer; and forming a second doped region having the second conductive type in a portion of the first conductive-type well exposed by the second gate electrode, the first offset spacer and the spacer.

2. The method of claim 1, wherein a diffusion rate of ions in the first doped region is faster than that in the second doped region.

3. The method of claim 2, wherein the first conductive type is P-type and the second conductive type is N-type.

4. The method of claim 2, wherein the first conductive type is N-type and the second conductive type is P-type.

5. A method of manufacturing a CMOS on a substrate having a first conductive-type well, a second conductive-type well, and an isolation structure formed therein, a first gate electrode on the second conductive-type well and a second gate electrode on the first conductive-type well, wherein the first conductive-type well and the second conductive-type well are partly isolated from each other by the isolation structure, the method comprising the steps of:

forming a first offset spacer on a sidewall of the first and the second gate electrodes and a second offset spacer on a sidewall of the first offset spacer, wherein a portion of the first offset spacer extends on a surface of the substrate and the second offset spacer is on the portion of the first offset spacer;

forming a first LDD region having the first conductive type in a portion of the second conductive-type well exposed by the first gate electrode, the first offset spacer and the second offset spacer;

removing the second offset spacer to expose a portion of the first offset spacer extending on a portion of a surface of the substrate;

forming a second LDD region having the second conductive type in a portion of the first conductive-type well, wherein the second LDD region extends from a region exposed by the second gate electrode and the first offset spacer to a region under the portion of the first offset spacer extending on a portion of a surface of the substrate;

forming a spacer on a sidewall of the first and the second gate electrodes;

forming a first doped region having the first conductive type in a portion of the second conductive-type well exposed by the first gate electrode, the first offset spacer and the spacer; and forming a second doped region having the second conductive type in a portion of the first conductive-type well exposed by the second gate electrode, the first offset spacer and the spacer.

6. The method of claim 1, wherein a diffusion rate of ions in the first doped region is faster than that in the second doped region.

7. The method of claim 1, wherein the first conductive type is P-type and the second conductive type is N-type.

8. The method of claim 1, wherein the first conductive type is N-type and the second conductive type is P-type.

* * * * *